United States Patent
Ren et al.

(10) Patent No.: US 11,127,735 B2
(45) Date of Patent: Sep. 21, 2021

(54) DISPLAY SUBSTRATE AREA SURROUNDED BY WIRING HAVING PLURALITY OF TIPS ON SIDE THEREOF

(71) Applicants: Ordos Yuansheng Optoelectronics Co., Ltd., Ordos (CN); BOE TECHNOLOGY GROUP CO., LTD., Beijing (CN)

(72) Inventors: Yanwei Ren, Beijing (CN); Jingyi Xu, Beijing (CN); Wulijibaier Tang, Beijing (CN); Tianlei Shi, Beijing (CN); Min Liu, Beijing (CN); Peng Liu, Beijing (CN)

(73) Assignees: Ordos Yuansheng Optoelectronics Co., Ltd., Ordos (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/433,599

(22) Filed: Jun. 6, 2019

(65) Prior Publication Data
US 2020/0075581 A1    Mar. 5, 2020

(30) Foreign Application Priority Data
Aug. 29, 2018 (CN) .......................... 201810994742.9

(51) Int. Cl.
*H01L 27/02* (2006.01)
*H01L 23/60* (2006.01)
*H01L 27/12* (2006.01)

(52) U.S. Cl.
CPC .......... *H01L 27/0296* (2013.01); *H01L 23/60* (2013.01); *H01L 27/124* (2013.01); *H01L 27/1259* (2013.01)

(58) Field of Classification Search
CPC ... H01L 23/60; H01L 27/0296; H01L 27/124; H01L 27/1259; H01L 27/0248;
(Continued)

(56) References Cited

U.S. PATENT DOCUMENTS

2014/0071384 A1*  3/2014  Ho ................... G02F 1/136204
                                                          349/106

FOREIGN PATENT DOCUMENTS

| CN | 101236315 A | * | 8/2008 |
| CN | 101236315 A |   | 8/2008 |

(Continued)

OTHER PUBLICATIONS

2nd Office Action dated Jul. 17, 2020 for Chinese Patent Application No. 201810994742.9.
(Continued)

*Primary Examiner* — Matthew E. Gordon
(74) *Attorney, Agent, or Firm* — Thomas | Horstemeyer, LLP

(57) ABSTRACT

A display substrate comprises a display area and a non-display area around the display area; at least one ground terminal located in the non-display area; a first wiring disposed in the non-display area and being around the display area; and a second wiring disposed between the first wiring and the display area and being positioned around the non-display area. The second wiring is provided with at least one tip on a side closer to the first wiring, the at least one tip pointing to the side of the first wiring. The first wiring and the second wiring are respectively connected to the at least one ground terminal.

13 Claims, 4 Drawing Sheets

(58) Field of Classification Search
CPC ... H05F 3/00; H05F 3/02; G02F 1/133; G02F 1/1345; G02F 1/1362
See application file for complete search history.

(56) References Cited

FOREIGN PATENT DOCUMENTS

| CN | 102967975   | 3/2013  |
|----|-------------|---------|
| CN | 104216566   | 12/2014 |
| CN | 104423112 A | 3/2015  |
| CN | 104461097   | 3/2015  |
| CN | 205069631   | 3/2016  |
| CN | 205264701   | 5/2016  |
| CN | 105974617   | 9/2016  |
| CN | 106773414   | 5/2017  |
| CN | 107463043   | 12/2017 |
| KR | 20060037635 | 5/2006  |

OTHER PUBLICATIONS

1st Office Action dated Mar. 16, 2020 for Chinese Patent Applicaiton No. 201810994742.9.

\* cited by examiner

*(PRIOR ART)*

DISPLAY SUBSTRATE AREA SURROUNDED BY WIRING HAVING PLURALITY OF TIPS ON SIDE THEREOF

CROSS-REFERENCE TO RELATED APPLICATIONS

The present application claims the benefit of and priority to Chinese Patent Application No. 201810994742.9 filed Aug. 29, 2018, the entire contents of which are incorporated herein by reference.

TECHNICAL FIELD

The present disclosure relates to the field of display technology and, more particularly, to a display substrate, a manufacturing method of a display substrate, and a display device mounted with the same.

BACKGROUND

Static electricity is always around us, both in daily life and industrial production. During production in the electronics industry, slight static electricity can especially make electronic devices ineffective. Static electricity greatly affects production efficiency and yield, and even makes production impossible, especially when delivering samples to customers. Customers will conduct electrostatic discharge test on electro-static discharge (ESD), so improving electrostatic discharge abilities is an important part of customer verification.

Therefore, it is necessary to develop a display substrate which does not easily store residual static electricity, as well as a manufacturing method of the display substrate and a display device mounted with the display substrate therein.

The above information disclosed in this Background section is only used to enhance an understanding of the background of the present disclosure, and thus may include information that does not constitute prior art known to those of ordinary skill in the art.

SUMMARY

According to an aspect of the present disclosure, a display substrate is provided including: a display area and a non-display area around the display area; at least one ground terminal in the non-display area; a first wiring in the non-display area and being around the display area; and a second wiring between the first wiring and the display area and being around the non-display area, the second wiring having at least one tip on a side closer to the first wiring, and the at least one tip pointing to the side of the first wiring, wherein, the first wiring and the second wiring are respectively connected to the at least one ground terminal.

In an example embodiment of the present disclosure, the second wiring is provided with a plurality of tips, the plurality of tips being around the display area.

In an example embodiment of the present disclosure, the second wiring is a closed loop.

In an example embodiment of the present disclosure, the first wiring is a closed loop.

In an example embodiment of the present disclosure, the first wiring is provided with a plurality of tips on a side away from the second wiring.

In an example embodiment of the present disclosure, a cross section of the tip parallel to a display surface of the display substrate is selected from a group consisting of a triangle, a quadrilateral having a sharp corner, and a pentagon having a sharp corner.

In an example embodiment of the present disclosure, for the plurality of tips provided in the second wiring, a distance between two adjacent tips is equal to a distance between other two adjacent tips.

In an example embodiment of the present disclosure, a distance between the first wiring and the second wiring is 30 µm to 100 µm.

In an example embodiment of the present disclosure, the first wiring and the second wiring are provided on one or both of an array substrate and a color filter substrate.

According to an aspect of the present disclosure, a manufacturing method of a display substrate is provided including: forming a display area and a non-display area around the display area; providing at least one ground terminal in the non-display area; forming a first wiring in the non-display area and being around the display area; forming a second wiring between the first wiring and the display area and being around the non-display area, the second wiring having at least one tip on a side closer to the first wiring, and the at least one tip pointing to the side of the first wiring; wherein, the first wiring and the second wiring are respectively connected to the at least one ground terminal.

In an example embodiment of the present disclosure, the second wiring is provided with a plurality of tips, the plurality of tips being around the display area.

In an example embodiment of the present disclosure, the second wiring is a closed loop.

In an example embodiment of the present disclosure, the first wiring is a closed loop.

In an example embodiment of the present disclosure, the first wiring is provided with a plurality of tips on a side away from the second wiring.

In an example embodiment of the present disclosure, a cross section of the tip parallel to a display surface of the display substrate is selected from a group consisting of a triangle, a quadrilateral having a sharp corner, and a pentagon having a sharp corner.

In an example embodiment of the present disclosure, a distance between the first wiring and the second wiring is 30 to 100 µm.

In an example embodiment of the present disclosure, the first wiring and the second wiring are formed on one or both of an array substrate and a color filter substrate.

According to one aspect of the present disclosure, there is provided a display device, including any of the display substrate described above.

BRIEF DESCRIPTION OF THE DRAWINGS

The features and advantages discussed above and other features and advantages of the present disclosure will become more apparent from the detailed description of the example embodiments.

DETAILED DESCRIPTION

Figure 1:
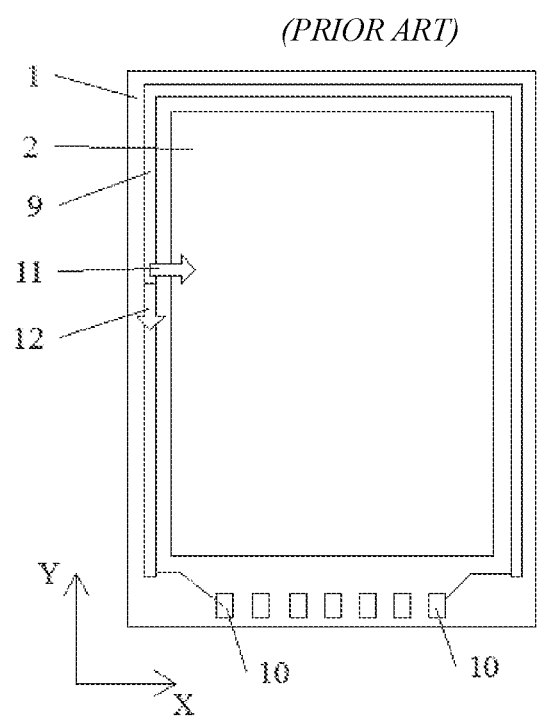
FIG. 1 is a schematic view showing a configuration structure of a grounding wire in the prior art.

Example embodiments will now be described more fully with reference to the accompanying drawings. However, the example embodiments can be embodied in a variety of forms and should not be construed as being limited to the embodiments set forth herein. Rather, these embodiments are provided so that this disclosure will be thorough and complete, and to fully convey the concept of the example embodiments to those skilled in the art. The same reference numerals in the drawings denote the same or similar structures, and thus their detailed description will be omitted.

FIG. 1 is a schematic view showing a configuration structure of a grounding wire in the prior art. A grounding wire 9 is disposed around an array substrate, and the grounding wire 9 is connected to a grounding terminal 10 of a circuit board to form a loop for discharging static electricity. Referring to the cross-sectional view taken along a line Y in FIG. 1, the array substrate includes a base substrate 6, a planarization layer 7 disposed on the base substrate 6, the grounding wire 9 disposed on the planarization layer 7, and an insulation layer 8 disposed on the grounding wire 9. Most of the static electricity is conducted through the first path 11 (i.e., the grounding wire 9).

Figure 2:
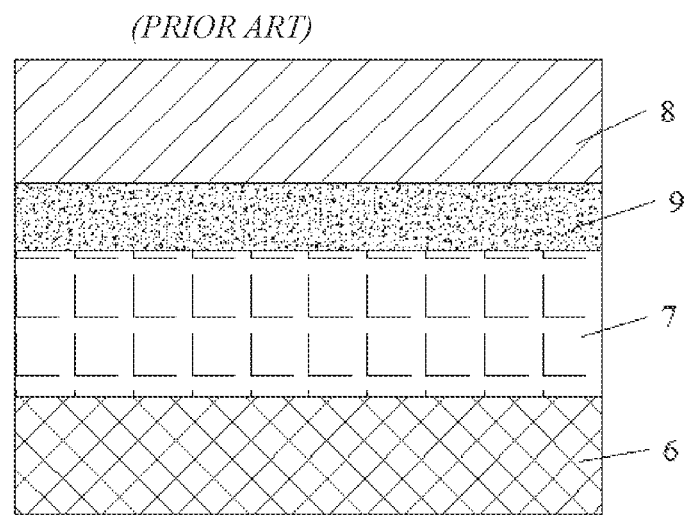
FIG. 2 is a cross-sectional view taken along a line Y in FIG. 1.
Figure 3:
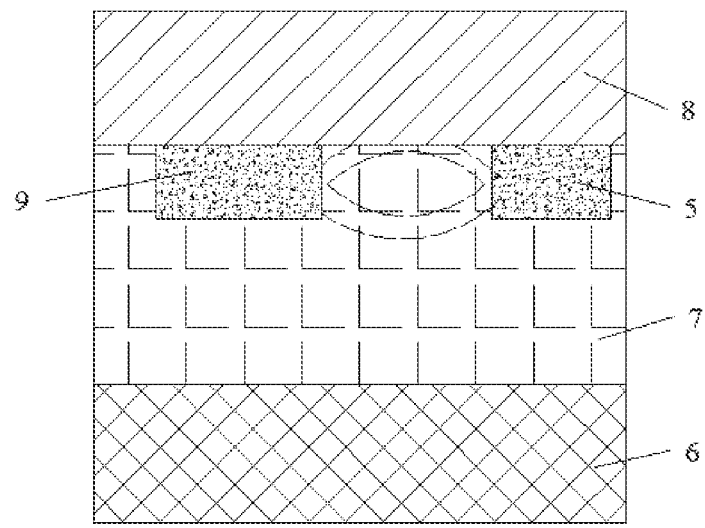
FIG. 3 is a cross-sectional view taken along a line X in FIG. 1.

However, the structure shown in FIGS. 1 and 2 has the following problems. FIG. 3 is a cross-sectional view taken along a line X in FIG. 1. In the structure shown in FIG. 1, another part of static electricity may be introduced into the display substrate through a second path 12 to cause damage to the circuit and make the display substrate display abnormally or appear reddish during the static electricity release test.

Figure 4:
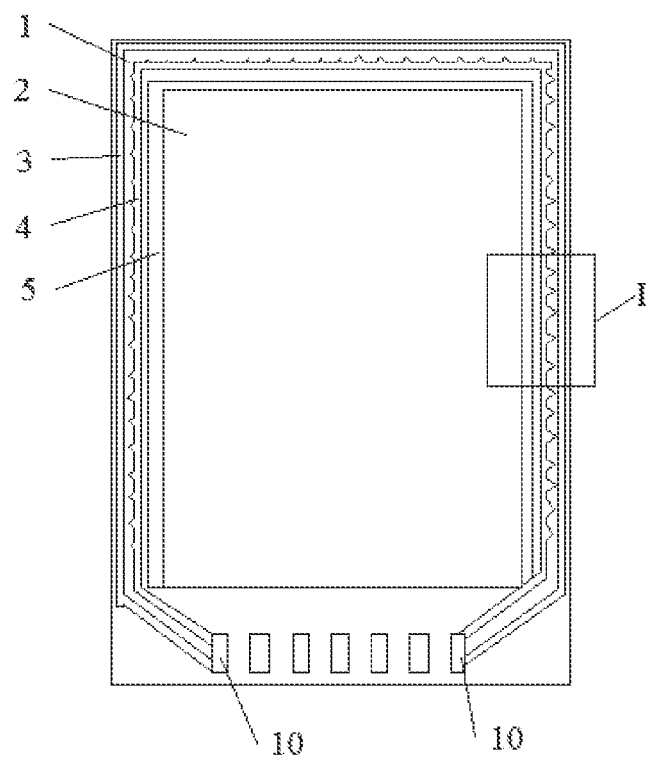
FIG. 4 is a schematic structural view of a display substrate according to an example embodiment of the present disclosure.

The present disclosure first provides a display substrate, as shown in FIG. 4, which is a schematic structural view of a display substrate according to an example embodiment of the present disclosure. The display substrate may include a display area 2 and a non-display area 1, a first wiring 3, and a second wiring 4. The first wiring 3 is disposed in the non-display area 1, the first wiring 3 being around the non-display area 1. The first wiring 3 is connected to the ground terminal 10. The second wiring 4 is disposed between the first wiring 3 and a display area 2, the second wiring 4 being around the display area 2. The second wiring 4 is connected to the ground terminal 10. A plurality of tips 41 are provided in the second wiring 4, where the tips 41 protrude toward the side of the first wiring 3.

In an example embodiment, the first wiring 3 and the second wiring 4 are both disposed on the array substrate, for instance, on the outer periphery of the display area 2 of the array substrate or, in other words, on the non-display area 1 of the array substrate (i.e., area other than the display area 2), and surrounding the display area 2 for substantially one circle. Two ground terminals 10 are disposed on the array substrate, and two ends of the first wiring 3 are connected to the two ground terminals 10 in a one-to-one correspondence. The second wiring 4 is disposed substantially in parallel to the first wiring 3, and the second wiring 4 is located on a side of the first wiring 3 adjacent to the display area 2. Both ends of the second wiring 4 are also connected to the two ground terminals 10 in a one-to-one correspondence. Static electricity can be conducted by the second wiring 4 and the first wiring 3, thereby conducting static electricity in more than one paths, and improving the efficiency of discharging static electricity and the amount of static electricity discharged.

In the present example embodiment, a gate driver on array (GOA) area 5 is further disposed on the outer periphery of the display area 2 of the array substrate, and the GOA area 5 is disposed between the display area 2 and the second wiring 4.

In addition, the first wiring 3 and the second wiring 4 may be both disposed on the color filter substrate to conduct the static electricity in the color filter substrate to prevent damage of the color filter substrate by static electricity. However, the first wiring 3 and the second wiring 4 may be disposed on both of the color filter substrate and the array substrate, thereby improving the efficiency of discharging static electricity and the amount of static electricity discharged from the entire display substrate, thereby avoiding electrostatic damage to the entire display substrate. It is also possible to provide the first wiring 3 and the second wiring 4 on other circuit boards of the display substrate, thereby improving the electrostatic discharge capability of the other circuit boards.

Figure 5:
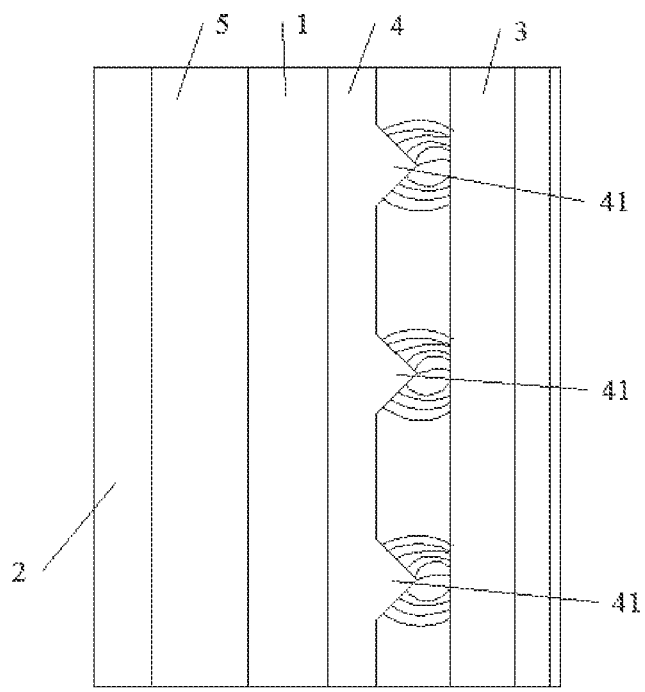
FIG. 5 is a partial enlarged view of the portion indicated by I in FIGS. 4, 6, and 7.

In the present example embodiment, the cross section of the tip 41 parallel to the display surface may be a triangle. Referring to FIG. 5, FIG. 5 is a partial enlarged view of the portion indicated by I in FIG. 4, showing that the triangle may be an isosceles acute triangle, and the bottom edge of the isosceles acute triangle is connected to the second wiring 4 and integrated with the second wiring 4. However, in other example embodiments of the present disclosure, the cross section of the tip 41 parallel to the display surface may also be a quadrilateral having a sharp corner, a pentagon having a sharp corner, and the like, so long as the corner points toward the side of the first wiring 3. The tips 41 can realize point discharge thereon, and conduct the static electricity that is not discharged by the second wiring 4 to the first wiring 3, preventing the static electricity in the second wiring 4 from being conducted to the display area 2. Thus, it can avoid damage caused by static electricity to the display area 2, and improve the electrostatic discharge capability.

In an example embodiment, the first wiring 3 is also provided with a plurality of tips 41 on a side closer to the second wiring 4, and the tip 41 pointing to the side away from the second wiring. The static electricity in the first wiring 3 can be conducted to the non-display area 1 through the tips 41 provided in the first wiring 3, thus the electrostatic discharge capability can be improved.

In the present example embodiment, the plurality of tips 41 are evenly distributed in the second wiring 4, and the uniformly distributed plurality of tips 41 can uniformly discharge the static electricity to the first wiring 3. The plurality of tips 41 being evenly distributed in the second wiring 4 means, for the plurality of tips in the second wiring, a distance between two adjacent tips is equal to a distance between other two adjacent tips 41. In addition, it will be understood by those skilled in the art that the plurality of tips 41 may also be unevenly distributed in the second wiring 4 to accommodate various wiring requirements.

In the present example embodiment, a distance between the first wiring 3 and the second wiring 4 is, for example, 30 to 100 μm. If the space is sufficient, the length of the tip 41 can be appropriately adjusted to select the distance between the first wiring 3 and the second wiring 4. The tip 41 protrudes from the second wiring 4 by a length smaller than the distance between the first wiring 3 and the second wiring 4. That is, a gap is formed between the tip 41 and the first wiring 3, so that the tip 41 can realize point discharge. Otherwise, if there is no gap between the tip 41 and the first wirings 3, that is, the tip 41 is integrally connected to the first wiring 3, the tip 41 cannot realize point discharge.

Figure 6:
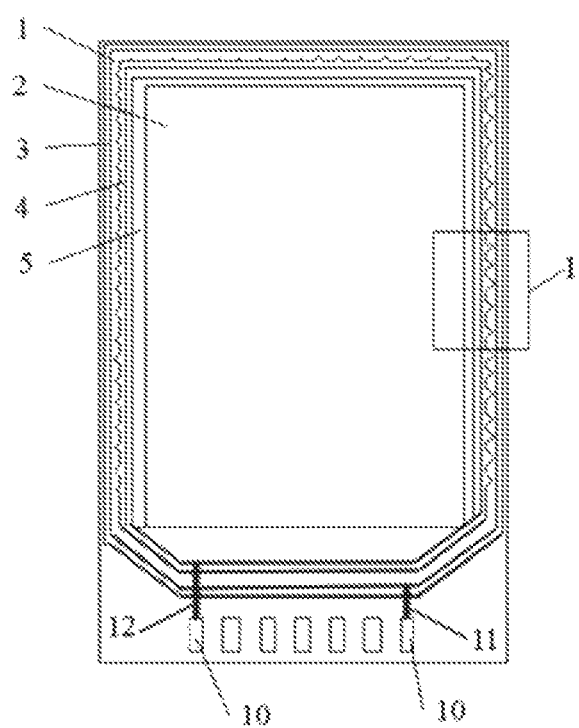
FIG. 6 is a schematic structural view of a display substrate according to an example embodiment of the present disclosure.

In an example embodiment, both the first wiring 3 and the second wiring 4 are closed loops. Referring to FIG. 6, the first wiring 3 is a closed loop connected to the ground terminals 10 by a connecting line 11. The second wiring 4 is a closed loop connected to the ground terminals 10 by a connecting line 12. In the case that the first wiring 3 and the second wiring 4 are closed loops, the area of the display area 2 that is not surrounded by the second wiring 4 is reduced, which is more favorable for the release of static electricity. Thus, electrostatic damage to the display area 2 is further avoided.

Figure 7:
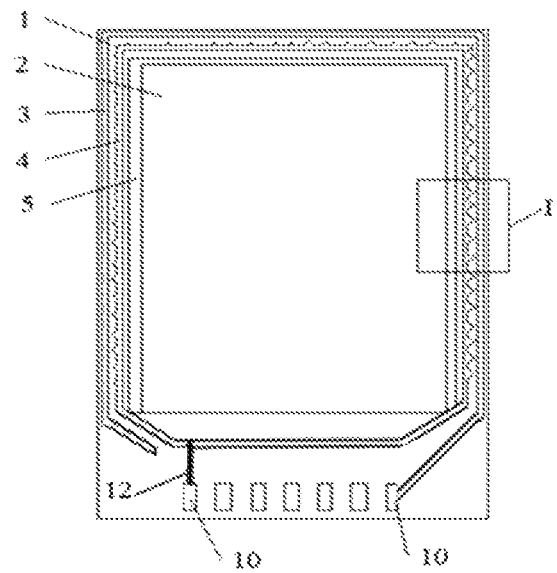
FIG. 7 is a schematic structural view of a display substrate according to an example embodiment of the present disclosure.

In an example embodiment, referring to FIG. 7, the first wiring 3 is a non-closed loop. The second wiring 4 is a closed loop connected to the ground terminals 10 by a connecting line 12. At least one of terminals of the first wiring 3 is connected to the ground terminals.

In an example embodiment, the first wiring 3 is a closed loop. The second wiring 4 is a non-closed loop. The first wiring 3 is connected to the ground terminals 10 by a connecting line. At least one of terminals of the second wiring 4 is connected to the ground terminals (not shown in the figures).

Figure 8:
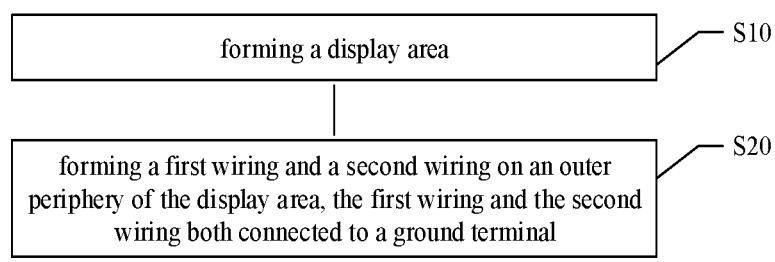
FIG. 8 is a schematic block diagram of a manufacturing method of a display substrate of the present disclosure.

Further, the present disclosure further provides a manufacturing method of the display substrate corresponding to the display substrate described above. Referring to FIG. 8, which is a schematic block diagram of a manufacturing method of a display substrate of the present disclosure. The manufacturing method of the display substrate may include the following steps.

In step S10, a display area 2 is formed.

In step S20, a first wiring 3 and a second wiring 4 are formed in a non-display area 1, and the first wiring 3 and the second wiring 4 are both connected to the ground terminals 10.

The second wiring 4 is disposed between the display area 2 and the first wiring 3, the second wiring 4 is provided with a plurality of tips 41, and the plurality of tips 41 are pointing towards the side of the first wiring 3.

The manufacturing method of the display substrate will be described in detail below.

In step S10, the display area 2 is formed.

In the present example embodiment, the display area 2 is the display area 2 of the array substrate, and the display area 2 is formed by the manufacturing method in the related art. A non-display area 1 is formed at the same time forming the display area 2. However, it can also be the display area 2 of the color filter substrate.

In step S20, the first wiring 3 and the second wiring 4 are formed in the non-display area, and the first wiring 3 and the second wiring 4 are both connected to the ground terminals 10.

In the present example embodiment, the first wiring 3 and the second wiring 4 may be formed at the time of forming a gate electrode or source and drain electrodes of the array substrate. For example, after the gate metal layer is formed, the gate electrode, the first wiring 3, and the second wiring 4 may be formed by one patterning process. The first wiring 3 and the second wiring 4 may be formed in the same layer without increasing the thickness of the display substrate. The first wiring 3 and the second wiring 4 may be formed by one patterning process without increasing the patterning process flow, thereby not reducing production capabilities.

In the present example embodiment, the cross section of the tip 41 parallel to the display surface is one or more of a triangle, a quadrilateral having a sharp corner, and a pentagon having a sharp corner.

In the present example embodiment, the distance between the first wiring 3 and the second wiring 4 is 30 to 100 μm.

In the present example embodiment, the first wiring 3 and the second wiring 4 are formed on one or both of the array substrate and the color filter substrate.

In an example embodiment, both the first wiring 3 and the second wiring 4 can be a closed loop. Alternatively, one of the first wiring 3 and the second wiring 4 can be a closed loop, and the other is a non-closed loop.

In an example embodiment, the first wiring 3 is also provided with a plurality of tips 41 on a side closer to the second wiring 4, and one or more of the tips 41 pointing to the side away from the second wiring 4. The static electricity in the first wiring 3 can be conducted to the non-display area 1 through the tips 41 provided in the first wiring 3, thus the electrostatic discharge capabilities can be improved.

Further, the present disclosure also provides a display device including the display substrate described above. The specific structure of the display substrate has been described in detail above, and therefore will not be described again herein.

The features, structures, or characteristics described above may be combined in any suitable manner in one or more embodiments, and the features discussed in the various embodiments are interchangeable, if possible. In the description above, numerous specific details are set forth to provide a thorough understanding of the embodiments of the disclosure. However, those skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although the relative terms such as "on" and "under" are used in the specification to describe the relative relationship of one component to another component as illustrated, these terms are used in this specification for convenience only, for example, according to the example direction in the accompanying drawings. It will be understood that if the device illustrated is flipped upside down, the component described on will become the component "under." When a structure is "on" other structure, it may mean that a structure is integrally formed on other structure, or that a structure is "directly" disposed on other structure, or that a structure is "indirectly" disposed on other through another structure.

In the present specification, the terms "a", "an", "the" and "said" are used to mean the presence of one or more elements/components, etc. The terms "comprising", "including", and "having" represent the meaning of nonexclusive including and means that there may be additional elements, components, etc. in addition to the listed elements, components, etc. The terms "first", "second" and "third" "etc. is used only as a token, not a limit on the number of objects.

It should be understood that the present disclosure does not limit its application to the detailed structure and arrangement of the components presented in the specification. The present disclosure can have other embodiments and can be implemented and performed in various manners. The foregoing variations and modifications are intended to fall within the scope of the present disclosure. It is to be understood that the disclosure disclosed and claimed herein extends to all alternative combinations of two or more individual features that are mentioned or apparent in the drawings. All of these different combinations constitute a number of alternative aspects of the present disclosure. The embodiments described in the specification are illustrative of the best modes of the present disclosure, and will enable those skilled in the art to utilize the present disclosure.

What is claimed is:

1. A display substrate, comprising:
a display area and a non-display area around the display area;
at least one ground terminal in the non-display area;
a first wiring in the non-display area, the first wiring being positioned around the display area; and
a second wiring between the first wiring and the display area, the second wiring being positioned around the display area, the second wiring having a plurality of tips on a side closer to the first wiring, and the plurality of tips pointing to the side of the first wiring;
wherein a cross-section of individual ones of the plurality of tips parallel to a display surface is an isosceles acute triangle, a bottom edge of the isosceles acute triangle being connected to and integrated with the second wiring;
wherein two ends of the first wiring are connected to two ground terminals in a one-to-one correspondence, the second wiring is disposed in parallel to the first wiring, and the second wiring is located on a side of the first wiring adjacent to the display area; and
wherein two ends of the second wiring are also connected to the two ground terminals in a one-to-one correspondence.

2. The display substrate according to claim 1, wherein, for the plurality of tips provided on the second wiring, a distance between two adjacent ones of the plurality of tips is equal to a distance between other two adjacent ones of the plurality of tips.

3. The display substrate according to claim 1, wherein a distance between the first wiring and the second wiring is 30 μm to 100 μm.

4. The display substrate according to claim 1, wherein the first wiring and the second wiring are provided on one or both of an array substrate and a color filter substrate.

5. The display substrate according to claim 1, wherein the plurality of tips are configured to realize point discharge thereon, and are configured to conduct static electricity that is not discharged by the second wiring to the first wiring, preventing the static electricity in the second wiring from being conducted to the display area.

6. A manufacturing method of a display substrate, comprising:
forming a display area and a non-display area around the display area;
providing at least one ground terminal in the non-display area;
forming a first wiring in the non-display area, the first wiring being positioned around the display area; and
forming a second wiring between the first wiring and the display area, the second wiring being positioned around the non-display area, the second wiring having a plurality of tips on a side closer to the first wiring, and the plurality of tips pointing to the side of the first wiring;
wherein a cross-section of individual ones of the plurality of tips parallel to a display surface is an isosceles acute triangle, a bottom edge of the isosceles acute triangle being connected to and integrated with the second wiring;
wherein two ends of the first wiring are connected to two ground terminals in a one-to-one correspondence, the second wiring is disposed in parallel to the first wiring, and the second wiring is located on a side of the first wiring adjacent to the display area; and
wherein two ends of the second wiring are also connected to the two ground terminals in a one-to-one correspondence.

7. The manufacturing method of a display substrate according to claim 6, wherein a distance between the first wiring and the second wiring is 30 to 100 μm.

8. The manufacturing method of a display substrate according to claim 6, wherein the first wiring and the second wiring are formed on one or both of an array substrate and a color filter substrate.

9. A display device, comprising:
a display substrate, comprising:
a display area and a non-display area around the display area;
at least one ground terminal in the non-display area;
a first wiring in the non-display area, the first wiring being positioned around the display area; and
a second wiring between the first wiring and the display area, the second wiring being positioned around the display area, the second wiring having a plurality of tips on a side closer to the first wiring, and the plurality of tips pointing to the side of the first wiring,
wherein a cross-section of individual ones of the plurality of tips parallel to a display surface is an isosceles acute triangle, a bottom edge of the isosceles acute triangle being connected to and integrated with the second wiring;
wherein two ends of the first wiring are connected to two ground terminals in a one-to-one correspondence, the second wiring is disposed in parallel to the first wiring, and the second wiring is located on a side of the first wiring adjacent to the display area; and
wherein two ends of the second wiring are also connected to the two ground terminals in a one-to-one correspondence.

10. The display device according to claim 9, wherein, for the plurality of tips provided on the second wiring, a distance between two adjacent ones of the plurality of tips is equal to a distance between other two adjacent ones of the plurality of tips.

11. The display device according to claim 9, wherein a distance between the first wiring and the second wiring is 30 μm to 100 μm.

12. The display device according to claim 9, wherein the first wiring and the second wiring are provided on one or both of an array substrate and a color filter substrate.

13. The display device according to claim 9, wherein the plurality of tips are configured to realize point discharge thereon, and are configured to conduct static electricity that is not discharged by the second wiring to the first wiring, preventing the static electricity in the second wiring from being conducted to the display area.

* * * * *